(12) United States Patent
Yamaguchi et al.

(10) Patent No.: US 7,053,133 B2
(45) Date of Patent: *May 30, 2006

(54) ULTRAVIOLET ACTIVATABLE ADHESIVE FILM

(76) Inventors: Hiroaki Yamaguchi, P.O. Box 33427, St. Paul, MN (US) 55133-3427; Tetsu Kitamura, P.O. Box 33427, St. Paul, MN (US) 55133-3427

(*) Notice: Subject to any disclaimer, the term of this patent is extended or adjusted under 35 U.S.C. 154(b) by 0 days.

This patent is subject to a terminal disclaimer.

(21) Appl. No.: 10/475,908

(22) PCT Filed: May 3, 2002

(86) PCT No.: PCT/US02/13924

§ 371 (c)(1),
(2), (4) Date: Oct. 27, 2003

(87) PCT Pub. No.: WO02/097002

PCT Pub. Date: Dec. 5, 2002

(65) Prior Publication Data

US 2004/0138325 A1    Jul. 15, 2004

(30) Foreign Application Priority Data

May 29, 2001  (JP) ............................. 2001-160759

(51) Int. Cl.
*B32B 27/38* (2006.01)
*B32B 25/14* (2006.01)
*C08F 2/46* (2006.01)

(52) U.S. Cl. ............................. 522/84; 522/86; 522/31; 522/66; 522/71; 522/81; 522/170; 522/181; 522/143; 522/141; 522/134; 428/355 R; 428/355 EP; 428/355 EN; 428/355 BL; 252/500; 252/501.1; 252/510; 252/511

(58) Field of Classification Search ................. 522/84, 522/86, 31, 66, 71, 81, 134, 141, 143, 170, 522/181; 428/355 R, 355 EP, 355 EN, 355 BL; 252/500, 501.1, 510, 511
See application file for complete search history.

(56) References Cited

U.S. PATENT DOCUMENTS

| | | | |
|---|---|---|---|
| 5,362,421 A * | 11/1994 | Kropp et al. ............... 252/512 |
| 5,494,943 A | 2/1996 | Mahoney et al. |
| 5,667,893 A * | 9/1997 | Kinzer et al. ............... 428/413 |
| 5,863,970 A * | 1/1999 | Ghoshal et al. ............. 523/434 |
| 6,294,270 B1 | 9/2001 | Clough |
| 6,309,502 B1 | 10/2001 | Hiroshige et al. |
| 6,699,351 B1 * | 3/2004 | Yamaguchi et al. ...... 156/275.7 |
| 2003/0051807 A1 * | 3/2003 | Yamaguchi et al ...... 156/272.2 |

FOREIGN PATENT DOCUMENTS

| | | |
|---|---|---|
| JP | 5-32799 | 2/1993 |
| JP | 7(1995)-197000 | 8/1995 |
| JP | 2000-290819 | 10/2000 |
| JP | 2002/047474 | 2/2002 |
| WO | WO 95/26385 | 10/1995 |
| WO | WO 01/72919 A | 10/2001 |

* cited by examiner

*Primary Examiner*—James J. Seidleck
*Assistant Examiner*—Sanza L. McClendon

(57) ABSTRACT

An ultraviolet activatable adhesive film comprising an epoxy resin, an ultraviolet activatable cationic polymerization catalyst and cationic polymerization inhibitor and water in an amount effective to suppress the cationic polymerization of the film and prolong the time from activation to thermal press-bonding after the ultraviolet activatable adhesive film is activated by irradiation by ultraviolet rays.

17 Claims, 1 Drawing Sheet

ULTRAVIOLET ACTIVATABLE ADHESIVE FILM

The present invention relates to an ultraviolet activatable adhesive film and a production method thereof.

BACKGROUND OF INVENTION

Heretofore, various epoxy resin compositions have been used as an adhesive over a wide range and various studies have been made with an attempt to improve the properties thereof. For example, Japanese Unexamined Patent Publication (Kokai) No. 7-197000 discloses a curable composition comprising an epoxy resin and an acid-modified styrene-based elastomer capable of reacting with the epoxy resin. In this composition, an acid-modified styrene-based elastomer is used, whereby not only the impact resistance of the epoxy resin composition but also the compatibility between the styrene-based elastomer and the epoxy resin is improved. In the composition, however, a reaction proceeds between the acidic functional group and the epoxy resin during storage and the usable time may be shortened. Furthermore, since the curing agent contained in this composition undertakes crosslinking by the polyaddition reaction, the reaction temperature is 150° C. or more and the reaction time is relatively long of tens of minutes. Accordingly, this composition is not suitable as an adhesive material for use in the electrical or electronic field where the curing is required to complete within a very short period of time.

Examples of the epoxy resin composition for use in the electrical or electronic field include an epoxy resin composition used for forming an anisotropic electrically conducting adhesive film described in Japanese Unexamined Patent Publication (Kokai) No. 5-32799. This epoxy resin composition comprises an epoxy resin and a reactive styrene-based elastomer and by dispersing electrically conducting particles in this composition and forming the composition into a film, an anisotropic electrically conducting adhesive film is formed. Use of this anisotropic electrically conducting adhesive film is advantageous in that circuit substrates, such as flexible printed circuit, can be adhered with a sufficiently high strength and the conductors such as connection terminal on the substrates opposing each other can be connected so as to enable electrical conduction therebetween without causing short circuit. In the case of using the anisotropic electrically conducting adhesive film, the conductors are generally adhered by interposing the anisotropic electrically conducting adhesive film between two circuit substrates and heating these while applying a pressure. By adhering as such, electrically conducting particles are sandwiched between two connection terminals opposing each other and the conductors are adhered in the state of being electrically conductive with each other, so that the electrical conduction can be attained between opposing connection terminals.

On the other hand, in order to meet the recent requirement for improvement of productivity, the adhesion must be accomplished within an extremely short adhesion time of 10 to 30 seconds. Accordingly, addition of a curing agent has been proposed as one means for meeting such a requirement. The adhesion can be accomplished within an extremely short period of time by using a curing agent, however, the composition having added thereto such a curing agent is stored in the state where a highly reactive curing agent and an epoxy resin are mixed, therefore, has a risk of being impaired in the storage stability at room temperature.

To overcome this problem, an ultraviolet activatable adhesive having added thereto a so-called "ultraviolet activatable cationic polymerization catalyst" which exhibits low catalytic activity unless irradiated with ultraviolet rays and is elevated in the catalytic activity upon irradiation of ultraviolet rays, has been proposed. For example, Japanese Unexamined Patent Publication (Kokai) No. 11-60899 discloses an electrically conducting epoxy resin composition comprising a cycloaliphatic epoxy resin, a diol, a styrene-based thermoplastic elastomer, an ultraviolet activatable cationic polymerization catalyst and electrically conducting particles, and states that this electrically conducting epoxy resin composition can be cured at a temperature of 70 to 120° C. within 30 seconds.

Such an ultraviolet activatable adhesive ensures storage stability for a long period of time as long as an ultraviolet ray is not irradiated, however, once activated by the irradiation of ultraviolet rays, the reactivity becomes high and the polymerization reaction is liable to gradually proceed. In the case of using a film comprising this adhesive for adhering substrates as described above, if the polymerization reaction excessively proceeds before thermally press-bonding the substrates with each other, the fluidity originally necessary for the adhesion and in turn, the wettability to the adherend substrates are reduced to exhibit bad adhesion properties in some cases.

It is possible to conducting thermally press-bonding while irradiating an ultraviolet ray to an ultraviolet activatable adhesive film, for example by using a quartz glass as a stage of a true press-bonding apparatus, and irradiating an ultraviolet ray from under the stage to an ultraviolet activatable adhesive film through the quartz glass and circuit substrate. However, it is impossible to avoid to irradiate an ultraviolet ray to circuit substrate. Therefore, this procedure is not adequate to a circuit substrate made of an ultraviolet ray sensitive material or low ultraviolet ray transmission material.

In order to overcome this problem, a technique of adding a stabilizer capable of inhibiting the cationic polymerization to such an ultraviolet activatable adhesive is known (for example, Japanese Unexamined International Patent Publication (Kohyo) No. 8-511572). This addition of a stabilizer capable of inhibiting the cationic polymerization can achieve effects of improving the storage stability of the ultraviolet activatable adhesive film and prolonging the usable time thereof, namely, shelf allowable time from the activation by the irradiation of ultraviolet rays to the thermal press-bonding.

However, in the case of producing the ultraviolet activatable film through steps of coating a solution comprising a solvent and an ultraviolet activatable adhesive containing such a stabilizer on a separator and drying the coating, the stabilizer content in the adhesive sometimes decreases in the drying step due to evaporation together with the solvent or sublimation by the heat at the time of drying. This tendency is more conspicuous in the portion closer to the surface of the adhesive film rather than the portion in the separator side. Accordingly, the portion in the surface side of the adhesive film produced as above, that is, in the side contacting with the first adherend has a lower stabilizer concentration than the portion in the separator side, as a result, the adhesive film may not have a sufficiently long usable time after the irradiation of ultraviolet rays.

The object of the present invention is to solve the above-described problems and provide an ultraviolet activatable adhesive film capable of ensuring high storage stability and long usable time after the irradiation of ultraviolet rays and maintaining a sufficiently high adhesion performance after the irradiation of ultraviolet rays as compared with conventional ultraviolet activatable adhesive films.

In order to solve the above-described problems, according to the present invention, an ultraviolet activatable adhesive film is provided, which is obtained by coating an ultraviolet activatable adhesive composition comprising an epoxy resin, an ultraviolet activatable cationic polymerization catalyst and a cationic polymerization inhibitor on a separator, drying the coating and then exposing the film to an atmosphere having a water vapor density of not less than 7 $\mu g/cm^3$ and less than the saturated water vapor.

Furthermore, according to the present invention, a method for producing an ultraviolet activatable adhesive film is provided, comprising mixing an epoxy resin, an ultraviolet activatable cationic polymerization catalyst and a cationic polymerization inhibitor to prepare an ultraviolet activatable adhesive composition, coating the ultraviolet activatable adhesive composition on a separator, drying the coating and exposing the film to an atmosphere having a water vapor density of not less than 7 $\mu g/cm^3$ and less than the saturated water vapor.

In the ultraviolet activatable adhesive film of the present invention, a predetermined amount of water molecules are incorporated into the adhesive layer by coating an ultraviolet activatable adhesive composition on a separator, drying the coating and exposing the film to an atmosphere having a predetermined water vapor density. The water molecule functions as a Lewis acid-base and has an effect of suppressing the cationic polymerization. Accordingly, the predetermined amount of water incorporated into the adhesive layer appropriately suppresses the cationic polymerization after the irradiation of ultraviolet rays and prolongs the usable time. The term "usable time" as used herein means a shelf allowance time from the activation of adhesive film by irradiating ultraviolet rays thereon to the thermal press-bonding of substrates.

Figure 1:
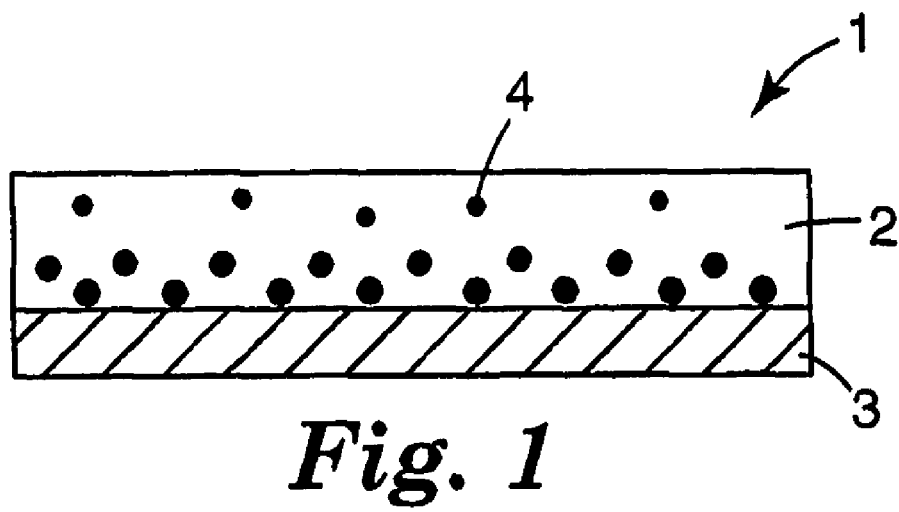
FIG. 1 is a concept view showing the construction of a conventional ultraviolet activatable adhesive film.

The ultraviolet activatable adhesive film of the present invention is obtained by coating an ultraviolet activatable adhesive composition comprising (1) an epoxy resin, (2) an ultraviolet activatable cationic polymerization catalyst and (3) a cationic polymerization inhibitor on a separator, drying the coating and exposing the film to an atmosphere having a water vapor density of not less than 7 $\mu g/cm^3$ and less than the saturated water vapor.

Examples of the epoxy resin which can be used include various epoxy resins conventionally used for epoxy resin adhesives. In the present invention, a cycloaliphatic epoxy resin and a glycidyl group-containing epoxy resin are preferably used in combination.

The cycloaliphatic epoxy resin, when used in combination with the ultraviolet activatable cationic polymerization catalyst, exhibits a function of enabling rapid curing at low temperatures. On the other hand, the glycidyl group-containing epoxy resin has a function of prolonging the usable time of adhesive film after the ultraviolet activation, in cooperation with a cationic polymerization inhibitor. This resin is lower in the reactivity than the cycloaliphatic epoxy resin and has a reactivity in the slightly high temperature region. The ultraviolet activatable cationic polymerization catalyst is a compound which produces a cationic activated seed such as Lewis acid upon irradiation of ultraviolet rays and catalyzes a ring-opening reaction of epoxy. The cationic polymerization inhibitor suppresses or inhibits the cationic polymerization reaction by partially displacing the cationic polymerization catalyst and trapping the cationic activated seed such as Lewis acid in the cationic polymerization, thereby prolonging the usable time of adhesive film.

For obtaining good electrical connection between substrates using an ultraviolet activatable adhesive film having added thereto electrically conducting particles, the adhesive component must be fully fluidized by the heat and pressure at the thermal press-bonding to satisfactorily remove electrically non-conductive adhesive components between the electrically conducting particle and the circuit on the circuit substrate. The fluidity of the adhesive component at the thermal press-bonding varies depending on the specific viscosity of resin in the adhesive and the elevation of viscosity due to the gradually proceeding heat curing reaction. The composition containing a cycloaliphatic epoxy resin as an epoxy resin and comprising an ultraviolet activatable cationic polymerization catalyst is characterized in that the storage stability at room temperature is high and the usable state can be maintained at least for 30 days because the composition has no catalytic action before the activation by ultraviolet rays, but after the activation by ultraviolet rays, the heat curing reaction rapidly proceeds at a low temperature. Since the heat curing reaction rapidly proceeds after the activation and the viscosity increases within a short time due to the heat curing reaction, the thermal press-bonding must be swiftly performed.

For delaying the curing reaction, it is proposed to add a cationic polymerization initiator. However, as shown in FIG. 1, an adhesive composition 2 is coated on a separator 3 and dried under heat to produce an adhesive film 1 and in this drying step, the cationic polymerization initiator 4 evaporates together with the solvent or sublimates due to the heat at the drying, as a result, the content of the cationic polymerization initiator 4 in the adhesive composition 2 decreases to fail in ensuring a sufficiently long usable time. This tendency is more remarkable in the surface side of the adhesive film where ultraviolet rays are irradiated. Accordingly, the heat-curing reaction proceeds particularly in the surface side of the adhesive film and the viscosity of the adhesive component increases. This causes failure in satisfactorily removing the adhesive component between the electrically conducting particle and the circuit on a circuit substrate and therefore, unstable electric connection is liable to result.

Figure 2:
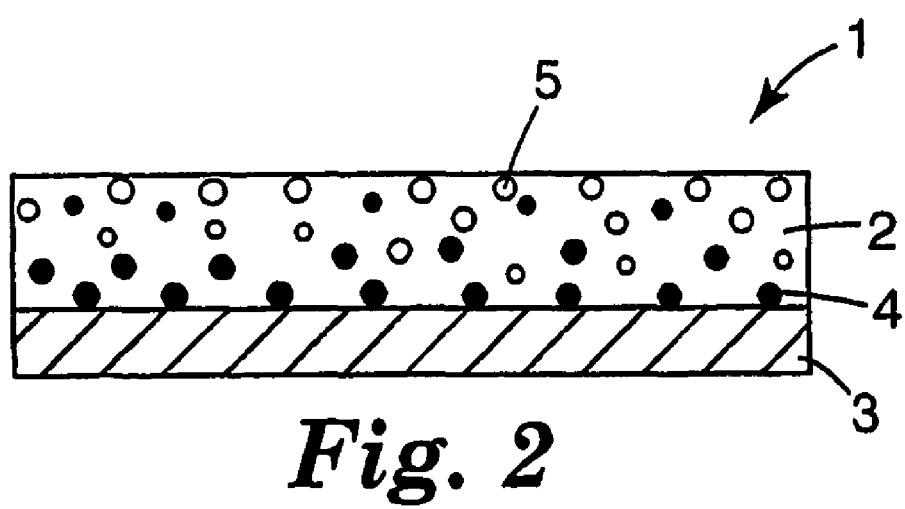
FIG. 2 is a concept view showing the construction of a ultraviolet activatable adhesive film according to the present invention.

The water molecule functions as a Lewis base and has an effect of inhibiting the cationic polymerization. Also, the water is a substance very safe on use. Therefore, in the present invention, the adhesive film obtained from an ultraviolet activatable adhesive comprising an epoxy resin, an ultraviolet activatable cationic polymerization catalyst and a cationic polymerization inhibitor is exposed to an atmosphere having a predetermined water vapor density, whereby a sufficiently long usable time is ensured. More specifically, as shown in FIG. 2, when an adhesive film 1 obtained by coating an adhesive composition 2 containing a cationic polymerization initiator 4 on a separator 3 and drying the coating is exposed to an atmosphere having a water vapor density of not less than 7 $\mu g/cm^3$ and less than the saturated water vapor, preferably not less than 10 $\mu g/cm^3$, more preferably not less than 12 $\mu g/cm^3$, the water molecule 5 permeates into the adhesive layer from the surface side of the adhesive film. As a result, the concentration of polymerization inhibitor 4 is low and the concentration of water molecule 5 is high in the surface area irradiated with ultraviolet rays, whereas the concentration of polymerization inhibitor 4 is high and the concentration of water molecule 5 is low on the portion in the separator side. This provides an effect of uniformly inhibiting the cationic polymerization in the adhesive layer, whereby the storage stability of adhesive film can be improved, the usable time after the irradiation of ultraviolet rays can be prolonged and the high adhesive strength can be maintained even after the irradiation of ultraviolet rays.

As described above, the ultraviolet activatable adhesive film of the present invention is characterized in that: (1) the curing reaction does not proceed before the activation by ultraviolet rays and therefore, the storage stability at room temperature is high; (2) the temperature can be elevated to a relatively high temperature before the activation (because the curing reaction does not proceed, for example, even at 80° C.), so that the drying for the film formation can be completed within a short period of time and the adhesive film can be produced with good efficiency (within a short period of time) as compared with conventional techniques; (3) the usable time after the activation by the irradiation of ultraviolet rays can be prolonged preferably to 10 minutes or more at an ordinary temperature and therefore, thermal press-bonding can be satisfactorily performed; (4) in the case where a material liable to deform under heat, such as FPC, TAB, both based on a polymer material (e.g., polyester, polyimide), PCB based on a glass-reinforced epoxy material, and a circuit substrate made of polycarbonate or polyether sulfone, is adhered to perform electrical connection, the deformation of the material can be suppressed to the minimum by thermally press-bonding it quickly (preferably within 1 minute, more preferably within 30 seconds, still more preferably within 10 seconds) at a low temperature on the order of 100 to 130° C.; and (5) the adhered substrates exhibit excellent interconnection.

Respective components constituting the preferred ultraviolet activatable anisotropic electrically conducting adhesive film are described below.

Cycloaliphatic Epoxy Resin

The cycloaliphatic epoxy resin improves the rapid curability and low-temperature curability of the adhesive composition, as described above. By the combination of this component with an ultraviolet activatable cationic polymerization catalyst, rapid curing at a low temperature can be realized. Furthermore, by virtue of its low viscosity, this component has a function of elevating the adhesion between the composition and the substrate. This cycloaliphatic epoxy resin is an epoxy resin having 2 or more cycloaliphatic epoxy groups on average within the molecule. Examples of the cycloaliphatic epoxy resin include vinylcyclohexene dioxide, 3,4-epoxycyclohexylmethyl-3,4-epoxycyclohexane carboxylate, bis(3,4-epoxycyclohexyl) adipate, 2-(3,4-epoxycyclohexyl-5,5-spiro-3,4-epoxy)cyclohexane-meta-dioxane, and combination thereof. In addition, a so-called polyfunctional cycloaliphatic epoxy having three, four or more epoxy groups within the molecule can also be used (for example, Epo-Lead GT, available from Daicel Chemical Industries, Ltd.).

This cycloaliphatic epoxy resin usually has an epoxy equivalent of 90 to 500, preferably from 100 to 400, more preferably from 120 to 300, most preferably from 210 to 235. If the epoxy equivalent is less than 90, the toughness after heat curing and the adhesion strength may decrease to reduce the connection reliability, whereas if the epoxy equivalent exceeds 500, the viscosity of the system as a whole becomes excessively high, giving rise to bad fluidity at the thermal press-bonding and reduction in the reactivity, and the connection reliability may decrease.

Glycidyl Group-Containing Epoxy Resin

The glycidyl group-containing epoxy resin has a function of prolonging the usable time of the adhesive film after the activation by ultraviolet rays, in cooperation with the cationic polymerization initiator, as described above. This component is lower in the reactivity than the cycloaliphatic epoxy resin and has a reactivity in the slightly high temperature region. If an adhesive film not containing a glycidyl group-containing epoxy resin and containing only a cycloaliphatic epoxy resin is used, the curing reaction readily proceeds even at a low temperature in vicinity of room temperature and the usable time after the activation by the irradiation of ultraviolet rays is disadvantageously short. Accordingly, for example, if the step of positioning the circuit substrates with each other takes a time and a long time is spent until the thermal press-bonding, the viscosity of the composition increases by the heat curing reaction to give rise to failure in satisfactorily removing the adhesive component between the electrically conducting particle and the circuit on each circuit substrate, and unstable electrical connection is liable to occur. The glycidyl group-containing epoxy resin compensates for this defect of the cycloaliphatic epoxy resin. The glycidyl group-containing epoxy resin used is an epoxy resin having two or more glycidyl groups on average within the molecule. Examples of the glycidyl group-containing epoxy resin include bisphenol A-type epoxy resin synthesized from bisphenol A and epichlorohydrin, low-viscosity bisphenol F-type epoxy resin, polyfunctional phenol novolak-type epoxy resin, o-cresol-type epoxy resin, and combination thereof. In addition, glycidyl ester-type epoxy resin such as glycidyl ester of hexahydrophthalic acid may also be used. However, the glycidyl group-containing epoxy resin is limited to an epoxy resin not having a group of inhibiting the cationic polymerization, for example, amine or a group containing sulfur or phosphorus.

This glycidyl group-containing epoxy resin usually has an epoxy equivalent of 170 to 5,500, preferably from 170 to 1,000, more preferably from 170 to 500, most preferably from 175 to 210. If the epoxy equivalent is less than 170, the toughness after heat curing and the adhesion strength may decrease, whereas if the epoxy equivalent exceeds 5,500, the viscosity of the system as a whole becomes too high, giving rise to bad fluidity at the thermal press-bonding and reduction in the reactivity, and the connection reliability may decrease.

Mixing Ratio Between Cycloaliphatic Epoxy Resin and Glycidyl Group-Containing Epoxy Resin The cycloaliphatic epoxy resin and the glycidyl group-containing epoxy resin provide a balance characteristic to good composition. More specifically, the adhesive provided can have both the low-temperature rapid curability of the alicyclic epoxy resin and the storage stability at room temperature of the glycidyl group-containing epoxy resin in good balance. The weight ratio of the cycloaliphatic epoxy resin to the glycidyl group-containing epoxy resin is generally from 10:90 to 98:2, preferably from 40:60 to 94:6, more preferably from 50:50 to 90:10, most preferably from 50:50 to 80:20. If the amount of the cycloaliphatic epoxy is less than 10% by weight of the total amount of the cycloaliphatic epoxy resin and the glycidyl group-containing epoxy resin, the curability at low temperatures decreases and a sufficiently high adhesive strength may not be attained or the connection reliability may decrease, whereas if the amount of the cycloaliphatic epoxy resin is exceeds 98% by weight, the curing reaction readily proceeds even in the vicinity of room temperature and therefore, the usable time after the irradiation of ultraviolet rays may be shortened.

Ultraviolet Activatable Cationic Polymerization Catalyst

The ultraviolet activatable cationic polymerization catalyst is a compound which produces a Lewis acid as the cationic activation seed upon irradiation of ultraviolet rays and catalyzes the ring-opening reaction of epoxy. Examples of this polymerization catalyst include aryl diazonium salt, diaryl iodonium salt, triaiyl sulfonium salt, triaryl selenium salt, and iron-arene complex. Among these, iron-arene complex is preferred because this is thermally stable, and specific examples thereof include xylene-cyclopentadienyl iron (II) hexafluoroantimonate, cumene-cyclopentadienyl iron (II) hexafluorophosphate, xylene-cyclopentadienyl iron(II)-tris(trifluoromethylsulfonyl)methide.

The amount of the ultraviolet activatable cationic polymerization catalyst is generally from 0.05 to 10.0 parts by mass, preferably from 0.075 to 7.0 parts by weight, more preferably from 0.1 to 4.0 parts by weight, most preferably from 1.0 to 2.5 parts by weight, per 100 parts by weight of the epoxy resin. If the amount is less than 0.05 parts by weight, the curability at low temperatures decreases, as a result, a sufficiently high adhesive strength may not be obtained or the connection reliability may decrease, whereas if the amount exceeds 10.0 parts by weight, the curing reaction readily proceeds even in the vicinity of room temperature and therefore, the storage stability at room temperature may decrease.

Cationic Polymerization Inhibitor

The cationic polymerization inhibitor suppresses or inhibits the cationic polymerization reaction by displacing a part of the cationic polymerization catalyst and by trapping a Lewis acid or the like as the cationic activated seed in the cationic polymerization. Specific examples thereof include crown ethers such as 15-crown-5, 1,10-phenanthroline and derivatives thereof, toluidines such as N,N-diethyl-meta-toluidine, phosphines such as triphenylphosphine, and triazines.

This cationic polymerization inhibitor is usually used in an amount of 0.01 to 10.0 equivalents, preferably from 0.05 to 5.0 equivalent, more preferably from 0.10 to 3.0 equivalents, most preferably from 0.4 to 2.0 equivalents, to the ultraviolet activatable cationic polymerization catalyst. If the amount of the cationic polymerization inhibitor exceeds 10.0 equivalents, the curing property at low temperatures is reduced and a sufficiently high adhesive strength may not be obtained, as a result, the connection reliability may decrease, whereas if the amount is less than 0.05 equivalents, the curing reaction readily proceeds even at room temperature and the storage stability at room temperature may decrease.

Electrically Conducting Particle

The electrically conducting particle which can be used is an electrically conducting particle such as metal particle (e.g., silver, copper, nickel, gold, tin, zinc, platinum, palladium, iron, tungsten, molybdenum, solder) and carbon particle, or a particle resulting from further applying an electrically conducting coating such as metal to the surface of those particles. Furthermore, a particle resulting from applying an electrically conducting coating such as metal to the surface of an electrically non-conducting particle such as polymer (e.g., polyethylene, polystyrene, phenol resin, epoxy resin, acrylic resin, benzoguanamine resin), glass bead, silica, graphite and ceramic, may also be used. The shape of electrically conducting particle is not limited specifically, however normally almost sphere shape is preferred. Even if the surface of the particle is somewhat uneven or spikelike, it is applicable. Also, the shape may be ellipse or needle.

The average particle size of electrically conducting particles used may be varied according to the width of the electrode used for connection and the distance between adjacent electrodes. For example, in the case where the electrode width is 50 μm and the distance between adjacent electrodes is 50 μm (namely, the electrode pitch is 100 μm), an average particle size on the order of 3 to 20 μm is suitable. When an anisotropic electrically conducting adhesive film having dispersed therein electrically conducting particles having an average particle size within this range is used, a sufficiently high electrically conducting property can be obtained and at the same time, the short circuit between adjacent electrodes can be satisfactorily prevented. Usually, the pitch of the electrode used for connecting circuit substrates with each other is from 50 to 1,000 μm and therefore, the average particle size of the electrically conducting particles is preferably from 2 to 40 μm. If the average particle size is less than 2 μm, the particles are entirely buried in asperities on the electrode surface and cannot function as an electrically conducting particle, whereas if it exceeds 40 μm, short circuit may be readily generated between adjacent electrodes.

The amount of electrically conducting particles added may be varied according to the area of the electrode used and the average particle size of the electrically conducting particles. As long as several (for example, from 2 to 10) electrically conducting particles are present per one electrode, good connection is usually attained. In the case of intending to more reduce the connection resistance, this may be attained by blending electrically conducting particles into the adhesive such that from 10 to 300 particles are present. Furthermore, in the case where a large pressure is imposed at the thermal press-bonding, the number of electrically conducting particles on the electrode may be increased to 300 to 1,000 particles to disperse the pressure and thereby attain good connection. The amount of electrically conducting particles is usually from 0.1 to 30 vol %, preferably from 0.5 to 10 vol %, more preferably from 1 to 5 vol %, based on the total volume of the adhesive containing electrically conducting particles. If the amount is less than 0.1 vol %, electrically conducting particles are highly probably not present on the electrode at the bonding and the connection reliability may decrease, whereas if the amount exceeds 30 vol %, short circuit is readily generated between adjacent electrodes.

Thermoplastic Elastomer or Resin

The thermoplastic elastomer or resin is preferably incorporated on forming the ultraviolet activatable adhesive into an adhesive film. This thermoplastic elastomer or resin elevates the film formability of the adhesive film, improves the impact resistance of the obtained adhesive film, relaxes the residual stress generated in the inside due to the curing reaction, and improves the bonding reliability. The thermoplastic elastomer is a kind of a polymer compound generally called thermoplastic elastomer consisting of a hard segment as a phase constrained at a certain temperature or less and a soft segment capable of exerting rubber elasticity. Such an elastomer includes a styrene-based thermoplastic elastomer and the styrene-based elastomer include, for example, a block copolymer containing a styrene unit in the hard segment and a polybutadiene unit, a polyisoprene unit or the like in the soft segment. Typical examples thereof include a styrene-butadiene-styrene block copolymer (SBS), a styrene-isoprene-styrene block copolymer (SIS), a styrene-(ethylene-butylene)-styrene block copolymer (SEBS) with the diene component as the soft segment being hydrogenated, a styrene-(ethylene-propylene)-styrene block copolymer (SEPS), and combinations thereof. Furthermore, styrene-based thermoplastic elastomers having a reactive group may also be used, such as an elastomer which is epoxy-modified with glycidyl methacrylate and an elastomer in which an unsaturated bond of the conjugate diene is epoxidized. In this type of elastomer having a reactive group, the compatibility with epoxy resin is elevated because of high polarity of the reactive group to broaden the blending latitude and at the same time, since the elastomer is incorporated into a crosslinked structure by the crosslinking reaction with epoxy resin, the resistance against heat and humidity after curing and in turn, the bonding reliability can be elevated. Examples of the epoxidized styrene-based elastomer include Epo-Friend A 1020 (produced by Daicel Chemical Industries, Ltd.). In the present invention, a thermoplastic resin may also be used in place of the thermoplastic elastomer. The thermoplastic resin must be fluidized and removed at the time of thermally press-bonding the adhesive film so as to attain good electrical connection between circuits on joined substrates and therefore, is limited to a resin having a Tg less than the temperature at the thermal press-bonding (for example, 100 to 130° C.). Examples of this resin include polystyrene resin, phenoxy resin, and combination thereof.

The amount of the thermoplastic elastomer or resin is usually from 10 to 900 parts by weight, preferably from 20 to 500 parts by weight, more preferably from 30 to 200 parts by weight, most preferably from 40 to 100 parts by weight, per 100 parts by weight of epoxy resin. If the amount is less than 10 parts by weight, the film formability of the adhesive may be reduced, whereas if it exceeds 900 parts by weight, the adhesive as a whole decreases in the fluidity to cause poor contact between the electrically conducting particle and the circuit substrate at the bonding, as a result, increase in the connection resistance or reduction in the connection reliability may occur or the adhesion strength may decrease.

Other Additives

The ultraviolet activatable adhesive composition may contain a cationic polymerization reaction accelerator in addition to the above-described components. By adding this reaction accelerator, the low-temperature curability and the rapid curability can be more improved. Examples of the reaction accelerator include di-tert-butyl oxalate. The amount of the reaction accelerator added is usually from 0.01 to 5 parts by weight, preferably from 0.05 to 3 parts by weight, more preferably from 0.1 to 2 parts by weight, per 100 parts by weight of the alicyclic epoxy resin and the glycidyl group-containing epoxy resin. In order to increase the bonding property between the circuit substrate and the adhesive film, a coupling agent such as γ-glycidoxypropyltrimethoxysilane and β-(3,4-epoxycyclohexyl)ethyltrimethoxysilane, may also be added.

Furthermore, as long as the effect of the present invention is not impaired, other additives such as an antioxidant (e.g., hindered phenol-based antioxidant), a diol (e.g., bis(phenoxyethalnol)fluorene), a chain transfer agent, a sensitizer (e.g., anthracene), a tackifier, a thermoplastic resin (e.g., polyvinylacetal, polyvinylbutyral, acrylic resin, and combinations thereof, a filler such as silica, a fluidity adjusting agent, a plasticizer, a defoaming agent, may be added to the adhesive composition.

Separator

This ultraviolet activatable adhesive composition is coated on a separator and dried to form an adhesive film. The formed ultraviolet activatable adhesive film is preferably protected from irradiation of unnecessary ultraviolet rays as much as possible before the film is irradiated with ultraviolet rays. Accordingly, although the separator may be a film obtained by forming a resin such as nylon, polyester, polypropylene, acryl-based resin, polycarbonate, vinyl resin, polyethylene and polyimide, this film used as the separator is preferably imparted with a function of reducing the ultraviolet transmission factor and has a release layer formed of a silicone-based or fluorine-based release agent on one surface or both surfaces thereof.

The ultraviolet transmission factor is preferably 10% or less at a wavelength of 300 to 400 nm. Examples of the method for reducing the ultraviolet transmission factor of the separator include a method of kneading an ultraviolet absorbing component into the film itself, a method of coating an ink containing an ultraviolet absorbing component on the film surface, and a method of forming a film of metal such as aluminum and nickel on the film surface by metallization or the like. The separator may be provided not only on one surface but also on both surfaces of the adhesive film.

Production Method of Ultraviolet Activatable Adhesive Film

The ultraviolet activatable adhesive film can be obtained by preparing a coating solution containing the ultraviolet activatable adhesive composition dissolved in an appropriate organic solvent, coating the coating solution on the separator using appropriate coating means such as knife coater, and drying the coating. This adhesive is stable and the curing reaction thereof does not proceed even at a high temperature of about 80° C. Accordingly, as long as the curing reaction does not proceed, the drying can be performed while elevating the temperature and thereby, the work efficiency can be enhanced. However, as the drying temperature is higher, the polymerization inhibitor is more lost and therefore, the drying is preferably performed at a low temperature of causing evaporation of the solvent. The thickness of the formed adhesive film is preferably from 5 to 100 μm so that on connecting by thermally press-bonding the substrates with each other, the connected part can be filled up without any void in a necessary and satisfactory manner.

The thus-produced adhesive film is exposed to an atmosphere having a water vapor density of not less than 7 μg/cm$^3$ and less than the saturated water vapor so as to incorporate water molecules into the adhesive layer. This atmosphere having a water vapor density of not less than 7 μg/cm$^3$ and less than the saturated water vapor means an atmosphere of more than a water vapor density corresponding to 25° C./30% RH and less than a dew point, for example, an atmosphere where with an atmosphere temperature of 50° C., a relative humidity is from 10% RH to less than 100% RH. The adhesive film is exposed to such an atmosphere for a time period on the order of allowing a sufficiently large number of water molecules to incorporate into the adhesive layer but not causing generation of a dew drop on the surface of the adhesive film. The dewing on the surface of the adhesive film causes extreme reduction of reactivity of the adhesive in that portion. Accordingly, the time period of exposing the adhesive film is preferably from 20 seconds to less than 1 hour.

The thus-produced ultraviolet activatable adhesive film has a low polymerization inhibitor concentration and a high water concentration in the surface area irradiated with ultraviolet rays but, on the other hand, has a high polymerization inhibitor concentration and a low water concentration on the portion in the separator side. As a result, an effect of uniformly inhibiting the cationic polymerization in the adhesive layer is brought out, so that the adhesive film can be improved in the storage stability or prolonged in the usable time after the irradiation of ultraviolet rays and the high adhesive strength can be maintained even after the irradiation of ultraviolet rays.

The present invention is described in greater detail below by referring to the Examples.

EXAMPLES

Production of Ultraviolet Activatable Anisotropic Electrically Conducting Adhesive Film 6.0 g of cycloaliphatic epoxy resin (Epo-Lead GT401, a trade name, produced by Daicel Chemical Industries, Ltd., epoxy equivalent: 219), 1.5 g of glycidyl group-containing epoxy resin (Epicote 154, Yuka Shell Epoxy Co., Ltd., epoxy equivalent: 178), 0.85 g of Irganox 1010 (tetralcis (methylene(3,5-di-tert-butyl-4-hydroxy hydrocinnamate) methane, Ciba Specialty Chemicals Corp.), 0.15 g of BPEF (bisphenoxyethanol fluorene, produced by Osaka Gas Chemical Co.) and 3.3 g of styrene-butadiene-styrene block copolymer (Epo-Friend CT128 (1.3 g), epoxy equivalent: 60 and Epo-Friend A1010 (2.0 g), epoxy equivalent: 510, both produced by Daicel Chemical Industries, Ltd.) were mixed with 12 g of tetrahydrofuran and stirred until a uniform solution was obtained. To this solution, electrically conducting particles (acrylic resin particle coated with nickel layer and gold layer, average particle size: 5 μm) were added and the solution was continuously stirred until the electrically conducting particles were thoroughly dispersed to obtain a dispersion. Separately, 0.125 g of ultraviolet activatable cationic polymerization catalyst (xylene-cyclopentadienyl iron(II) (tris(trifluoromethyl-sulfonyl)methide), 0.033 g of cationic polymerization inhibitor (N,N-diethyl-m-toluidine), 0.25 of silane coupling agent (A187, a trade name, produced by Nippon Unicar Co., Ltd., γ-glycidoxypropyltrimethoxysilane) and 0.6 g of methyl ethyl ketone were mixed and stirred until a uniform solution was obtained. This was added to the dispersion prepared above and the mixed solution was further stirred to obtain an ultraviolet activatable anisotropic electrically conducting adhesive composition. This adhesive was coated on a silicone-treated polyester film (separator) using a knife coater, dried at 60° C. for 10 minutes and then exposed to an atmosphere having a water vapor density of 14 μg/cm$^3$ (25° C.-60% RH) for about 1 minute to form a 20 μm-thick ultraviolet activatable anisotropic electrically conducting adhesive film (E-1).

Also, 4.0 g of cycloaliphatic epoxy resin (Cyracure UVR6128, a trade name, produced by Union Carbide Japan Corp., epoxy equivalent: 200), 1.5 g of glycidyl group-containing epoxy resin (Epicote 154, a trade name, produced by Yuka Shell Epoxy Co., Ltd.) and 4.5 g of Paphen PKHC (phenoxy resin, produced by Phenoxy Associates Co., Ltd.) were mixed with 9 g of methyl ethyl ketone and stirred until a uniform solution was obtained. Thereto, the same electrically conducting particles as above were added to have a final solid content of 3 vol % and the solution was continuously stirred until the electrically conducting particles were thoroughly dispersed to obtain a dispersion. Separately, 0.120 g of ultraviolet activatable cationic polymerization catalyst (xylene-cyclopentadienyl iron(II) (tris(trifluoromethylsulfonyl)methide), 0.016 g of cationic polymerization inhibitor (N,N-diethyl-m-toluidine), 0.1 of silane coupling agent (A187, a trade name, produced by Nippon Unicar Co., Ltd., γ-glycidoxypropyltrimethoxysilane) and 0.6 g of methyl ethyl ketone were mixed and stirred until a uniform solution was obtained. This was added to the dispersion prepared above and the mixed solution was further stirred to obtain an ultraviolet activatable anisotropic electrically conducting adhesive composition. This adhesive was coated on a silicone-treated polyester film (separator) using a knife coater, dried at 60° C. for 10 minutes and then exposed to an atmosphere having a water vapor density of 11 μg/cm$^3$ (26° C.-40% RH) for about 1 minute to form a 20 μm-thick ultraviolet activatable anisotropic electrically conducting adhesive film (E-2).

Furthermore, an ultraviolet activatable anisotropic electrically conducting adhesive film (C-1) was obtained in the same manner as E-1 except for exposing the coating to an atmosphere having a water vapor density of 6 μg/cm$^3$ (22° C.-32% RH). Also, an ultraviolet activatable anisotropic electrically conducting adhesive film (C-2) was obtained in the same manner as E-2 except for exposing the coating to an atmosphere having a water vapor density of 6 μg/cm$^3$ (25° C.-27% RH). In addition, an ultraviolet activatable anisotropic electrically conducting adhesive film (C-3) as obtained in the same manner as E-2 except for exposing the coating to an atmosphere of saturated water vapor (density of saturated water vapor at 25° C. is 24 μg/cm$^3$) for one minute. Condensation of water was observed on the adhesive film surface.

Production of Circuit Substrate Specimen for Connection Test

The thus-obtained ultraviolet activatable anisotropic electrically conducting adhesive films each having a width of 2 mm and a length of 4 cm were irradiated with ultraviolet rays having a center wavelength of 365 nm under air cooling. E-1 and C-1 were irradiated with ultraviolet rays having an intensity of 80 mW/cm$^2$ for 10 seconds and E-2 and C-2 were irradiated with ultraviolet rays having an intensity of 120 mW/cm$^2$ for 5 seconds. Each ultraviolet activatable anisotropic electrically conducting adhesive film irradiated above with ultraviolet rays was adhered to a 0.7 mm-thick glass substrate with an ITO (indium tin oxide) film and thermally press-bonded at 30° C. and a pressure of 1.0 MPa for 3 seconds and then, the polyester film as the separator was peeled off (temporary press-bonding). Thereafter, a flexible circuit constructed by a gold-plated copper wire having a conductor pitch of 70 μm, a conductor width of 35 μm and a thickness of 12 μm formed on a 25 μm-thick polyimide film was positioned and fixed on each of the temporarily press-bonded ultraviolet activatable anisotropic electrically conducting films. Minutes after the irradiation of ultraviolet rays thereon, the ultraviolet activatable anisotropic electrically conducting film portion was thermally press-bonded at 120° C. and a pressure of 2.0 MPa for 10 seconds to obtain a circuit specimen for connection test (true press-bonding).

Evaluation of Connected State

The connection resistance between the glass substrate with an ITO film and the flexible circuit in each of the thus-produced circuit specimens for connection test was measured using a digital multimeter. While fixing the glass support having thereon an Evaluation of Connected State The connection resistance between the glass substrate with an ITO film and the flexible circuit in each of the thus-produced circuit specimens for connection test was measured using a digital multimeter. While fixing the glass support having thereon an ITO film, the flexible circuit was pulled at an angle of 90° to determine the peel adhesion strength. Furthermore, the reactivity of the adhesive film after the irradiation of ultraviolet rays was examined using a differential scanning calorimeter. The results obtained are shown in Table 1 below.

TABLE 1

(Evaluation Results)

| Ultraviolet Activatable Anisotropic Electrically Conducting Adhesive Film | E-1 Example | C-1 Comparative Example | E-2 Example | C-2 Comparative Example | C-3 Comparative Example |
|---|---|---|---|---|---|
| Water Vapor Density at Production of Adhesive Film ($\mu g/cm^3$) | 14 | 6 | 11 | 6 | 24 |
| DSC Measurement | | | | | |
| Peak Temp (° C.) $1^{st}/2^{nd}$ | 65/88 | 58/86 | 65/97 | 61/97 | 71/98 |
| Calorific Value (J/g) | 229 | 236 | 222 | 214 | 219 |
| Circuit Connection Test | | | | | |
| Avg. Connection Resistance ($\Omega$) | 15 | 19 | 21 | 22 | 18 |
| Average Peel Strength (N/m) | 592 (cohesive failure) | 123 (interfacial failure) | 536 (cohesive failure) | 380 (interfacial failure) | 250 (interfacial failure) |
| General Evaluation | good | slightly weak peel adhesive strength | good | slightly weak peel adhesive strength | slightly weak peel adhesive strength |

From the results in the peel adhesive strength, the adhesive films of the present invention are verified to have high adhesive performance as compared with Comparative Examples. Furthermore, there is not so great difference in the activity peak temperature measured by the differential scanning calorimeter and this reveals that the reactivity does not decrease even if the film is exposed to water vapor. Also, it is seen from the results in the connection resistance that the adhesive films of the present invention have the good connection characteristics equal to those of Comparative Examples.

As described in the above, the ultraviolet activatable adhesive film of the present invention has excellent storage stability and at the same time, due to the incorporation of water in the vicinity of the surface thereof, can be favored with effects such that the curing of the adhesive component after the activation by ultraviolet irradiation is prevented, the usable time is prolonged and high adhesive property is maintained.

The invention claimed is:

1. An ultraviolet activatable adhesive film having a surface to be exposed to ultraviolet radiation comprising an epoxy resin, an ultraviolet activatable cationic polymerization catalyst and a cationic polymerization inhibitor and water within the surface of the adhesive film to be exposed to ultraviolet radiation in an amount effective to suppress the cationic polymerization of the film and prolong the time from activation to thermal press-bonding bonding after the ultraviolet activatable adhesive film is activated by irradiation by ultraviolet rays.

2. The ultraviolet activatable adhesive film as of claim 1, wherein said epoxy resin contains a cycloaliphatic epoxy resin and a glycidyl group-containing epoxy resin.

3. The ultraviolet activatable adhesive film of claim 2, wherein the ratio by weight of said cycloaliphatic epoxy resin to said glycidyl group-containing epoxy resin is from 10:90 to 98:2.

4. The ultraviolet activatable adhesive film of claim 1, wherein said ultraviolet activatable adhesive composition further contains electrically conducting particles.

5. The ultraviolet activatable adhesive film of claim 1, wherein said ultraviolet activatable adhesive composition further contains a thermoplastic elastomer or resin.

6. The ultraviolet activatable adhesive film of claim 5, wherein said thermoplastic elastomer or resin is a phenoxy resin and is present in an amount of 10 to 900 parts by weight per 100 parts by weight of the epoxy resin.

7. A method for producing an ultraviolet activatable adhesive film comprising mixing an epoxy resin, an ultraviolet activatable cationic polymerization catalyst and a cationic polymerization inhibitor to prepare an ultraviolet activatable adhesive composition, coating said ultraviolet activatable adhesive composition on a separator, drying the coating and after drying, exposing the film to an atmosphere having a water vapor density of not less than 11 μg/cm$^3$ and not more than 24 μg/cm$^3$ and less than the saturated water vapor.

8. The method of claim 7, wherein said epoxy resin comprises a cycloaliphatic epoxy resin and a glycidyl group-containing epoxy resin.

9. The method of claim 8, wherein the ratio by weight of said cycloaliphatic epoxy resin to the glycidyl group-containing epoxy resin is from 10:90 to 98:2.

10. The method of claim 8, wherein said ultraviolet activatable adhesive composition further contains electrically conducting particles.

11. The method of claim 8, wherein said ultraviolet activatable adhesive composition further contains a thermoplastic elastomer or resin.

12. The method of claim 11, wherein said thermoplastic elastomer or resin is a phenoxy resin and contained in an amount of 10 to 900 parts by weight per 100 parts by weight of the epoxy resin.

13. The method of claim 7, wherein the time period of exposing the film to the atmosphere is from 20 seconds to less than 1 hour.

14. An article comprising a substrate, said substrate having an outer surface, and the ultraviolet activatable adhesive film of claim 1 on at least a portion of said outer surface.

15. An article comprising a first substrate, a second substrate, and an ultraviolet activatable adhesive film having a surface to be exposed to ultraviolet radiation comprising an epoxy resin, an ultraviolet activatable cationic polymerization catalyst, a cationic polymerization inhibitor, electrically conducting particles, and water on the surface of the adhesive film to be exposed to ultraviolet radiation in an amount effective to suppress the cationic polymerization of the film and prolong the time from activation to thermal press-bonding after the ultraviolet activatable adhesive film is activated by irradiation by ultraviolet rays positioned between said first or said second substrate, wherein said adhesive film has been activated by irradiation before said substrates are combined.

16. An ultraviolet activatable adhesive film having a surface to be exposed to ultraviolet radiation comprising a cycloaliphatic epoxy resin and a glycidyl group-containing epoxy resin, an ultraviolet activatable cationic polymerization catalyst and a cationic polymerization inhibitor and water on the surface of the adhesive film to be exposed to ultraviolet radiation in an amount effective to suppress the cationic polymerization of the film and prolong the time from activation to thermal press-bonding after the ultraviolet activatable adhesive film is activated by irradiation by ultraviolet rays, wherein the ratio by weight of said cycloaliphatic epoxy resin to said glycidyl group-containing epoxy resin is from 10:90 to 98:2.

17. An ultraviolet activatable adhesive film having a surface to be exposed to ultraviolet radiation comprising an epoxy resin and a thermoplastic elastomer or resin, an ultraviolet activatable cationic polymerization catalyst and a cationic polymerization inhibitor and water on the surface of the adhesive film to be exposed to ultraviolet radiation in an amount effective to suppress the cationic polymerization of the film and prolong the time from activation to thermal press-bonding after the ultraviolet activatable adhesive film is activated by irradiation by ultraviolet rays, wherein said thermoplastic elastomer or resin is a phenoxy resin and is present in an amount of 10 to 900 parts by weight per 100 parts by weight of the epoxy resin.

\* \* \* \* \*

UNITED STATES PATENT AND TRADEMARK OFFICE
CERTIFICATE OF CORRECTION

| | |
|---|---|
| PATENT NO. | : 7,053,133 B2 |
| APPLICATION NO. | : 10/475908 |
| DATED | : May 30, 2006 |
| INVENTOR(S) | : Hiroaki Yamaguchi |

It is certified that error appears in the above-identified patent and that said Letters Patent is hereby corrected as shown below:

Column 7,
Line 14, delete "triaiyl sulfonium salt" and insert in place thereof -- triaryl sulfonium salt --.

Column 11,
Line 27, delete "(tetralcis" and insert in place thereof -- (tetrakis --.

Column 14,
Line 9, delete "press-bonding bonding" and insert in place thereof -- press-bonding --.

Signed and Sealed this

Twenty-seventh Day of March, 2007

JON W. DUDAS
*Director of the United States Patent and Trademark Office*